US012635339B2

(12) United States Patent
Lee et al.

(10) Patent No.: US 12,635,339 B2
(45) Date of Patent: May 19, 2026

(54) DISPLAY PANEL HAVING TRANSPARENT ELECTRODE CONNECTED TO PIXEL CIRCUIT, AND ELECTRONIC APPARATUS INCLUDING THE SAME

(71) Applicant: Samsung Display Co., Ltd., Yongin-si (KR)

(72) Inventors: Wonse Lee, Yongin-si (KR); Jieun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 471 days.

(21) Appl. No.: 18/109,754

(22) Filed: Feb. 14, 2023

(65) Prior Publication Data

US 2023/0309344 A1 Sep. 28, 2023

(30) Foreign Application Priority Data

Mar. 28, 2022 (KR) ........................ 10-2022-0038325

(51) Int. Cl.
 H10K 59/121 (2023.01)
 H10K 59/12 (2023.01)
 (Continued)

(52) U.S. Cl.
 CPC ..... H10K 59/1213 (2023.02); H10K 59/1201 (2023.02); H10K 59/122 (2023.02); H10K 59/124 (2023.02); H10K 71/00 (2023.02)

(58) Field of Classification Search
 CPC .......... H10K 59/1213; H10K 59/1201; H10K 59/122; H10K 59/124; H10K 71/00;
 (Continued)

(56) References Cited

U.S. PATENT DOCUMENTS

| | | |
|---|---|---|
| 8,981,386 B2 | 3/2015 | Lim et al. |
| 9,780,155 B2 | 10/2017 | You |

(Continued)

FOREIGN PATENT DOCUMENTS

| | | |
|---|---|---|
| JP | 2016-149191 A | 8/2016 |
| KR | 10-2005-0108049 A | 11/2005 |

(Continued)

*Primary Examiner* — Jacob Y Choi
*Assistant Examiner* — Grace Cha
(74) *Attorney, Agent, or Firm* — Womble Bond Dickinson (US) LLP

(57) ABSTRACT

An electronic apparatus includes: a display panel comprising a first display area, in which a first display element is arranged, and a second display area, in which a second display element and a transmission area are arranged; and a component on a lower surface of the display panel and overlapping the second display area, wherein the display panel includes: a substrate; a second pixel circuit on the substrate and electrically connected to the second display element, the second pixel circuit comprising at least one thin-film transistor; an organic insulating layer covering the at least one thin-film transistor; and a second transparent connection electrode on the organic insulating layer in the second display area and electrically connected to the second pixel circuit, wherein the second display element comprises a second pixel electrode on a same layer as the second transparent connection electrode.

15 Claims, 14 Drawing Sheets

(51) Int. Cl.
    *H10K 59/122*     (2023.01)
    *H10K 59/124*     (2023.01)
    *H10K 71/00*     (2023.01)

(58) Field of Classification Search
    CPC .... H10K 59/123; H10K 59/65; H10K 59/121;
                H10K 50/813; H10K 50/818; H10K
                      50/865; H10K 59/131
    See application file for complete search history.

(56)               References Cited

U.S. PATENT DOCUMENTS

| | | | |
|---|---|---|---|
| 2012/0061653 A1 | 3/2012 | Yamazaki et al. | |
| 2015/0097171 A1* | 4/2015 | Kim ................ | H10K 59/80522 |
| | | | 438/23 |
| 2016/0233275 A1 | 8/2016 | Toyoda | |
| 2019/0165065 A1* | 5/2019 | Kong ................... | H10K 59/126 |
| 2020/0321427 A1* | 10/2020 | Park ..................... | H10K 59/131 |
| 2020/0349891 A1 | 11/2020 | Cho et al. | |
| 2021/0255731 A1* | 8/2021 | Kim ..................... | G06F 3/0412 |
| 2021/0359266 A1 | 11/2021 | Bang et al. | |

FOREIGN PATENT DOCUMENTS

| | | |
|---|---|---|
| KR | 10-2006-0059095 A | 6/2006 |
| KR | 10-2011-0124331 A | 11/2011 |
| KR | 10-2016-0059049 A | 5/2016 |
| KR | 10-2020-0006211 A | 1/2020 |
| KR | 10-2021-0104399 A | 8/2021 |
| KR | 10-2021-0142030 A | 11/2021 |

* cited by examiner

DISPLAY PANEL HAVING TRANSPARENT ELECTRODE CONNECTED TO PIXEL CIRCUIT, AND ELECTRONIC APPARATUS INCLUDING THE SAME

CROSS-REFERENCE TO RELATED APPLICATION

The present application claims priority to and the benefit of Korean Patent Application No. 10-2022-0038325, filed on Mar. 28, 2022, in the Korean Intellectual Property Office, the entire disclosure of which is incorporated herein by reference.

BACKGROUND

1. Field

Aspects of one or more embodiments relate to a display panel, an electronic apparatus including the display panel, and a method of manufacturing the display panel.

2. Description of the Related Art

Recently, the various uses and applications of display panels has diversified. Also, display panels have become thinner and more lightweight, and thus, the use of display panels has generally expanded.

While increasing the area occupied by a display area in display panels, various functions have been incorporated into display panels. In order to further increase the area and add various functions, studies have been conducted into a display device having, in the display area, an area for adding various functions other than an image displaying function.

The above information disclosed in this Background section is only for enhancement of understanding of the background and therefore the information discussed in this Background section does not necessarily constitute prior art.

SUMMARY

Aspects of one or more embodiments include a display panel with relatively improved reflective color bands, an electronic apparatus including the display panel, and a method of manufacturing the display panel.

Additional aspects will be set forth in part in the description which follows and, in part, will be apparent from the description, or may be learned by practice of the presented embodiments of the disclosure.

According to some embodiments, an electronic apparatus includes a display panel including a first display area, in which a first display element is arranged, and a second display area, in which a second display element and a transmission area are arranged, and a component on a lower surface of the display panel and overlapping the second display area, wherein the display panel includes a substrate, a second pixel circuit on the substrate and electrically connected to the second display element, the second pixel circuit including at least one thin-film transistor, an organic insulating layer covering the at least one thin-film transistor, and a second transparent connection electrode on the organic insulating layer in the second display area and electrically connected to the second pixel circuit, wherein the second display element including a second pixel electrode arranged on a same layer as the second transparent connection electrode.

2

According to some embodiments, the second pixel electrode may include a reflective material.

According to some embodiments, the second pixel electrode may cover one end of the second transparent connection electrode.

According to some embodiments, the second pixel electrode may include a first layer and a second layer on the first layer, the first layer including a reflective material and the second layer including a transparent conductive material.

According to some embodiments, the second transparent connection electrode may be arranged inside a via hole defined in the organic insulating layer.

According to some embodiments, the second pixel electrode may include a first layer including a reflective material and a third layer under the first layer, and the third layer may be integral with the second transparent connection electrode.

According to some embodiments, at least a portion of an edge of the second pixel electrode may have a round shape.

According to some embodiments, the electronic apparatus may further include a pixel defining layer having an opening exposing a center of the second pixel electrode and covering an edge of the second pixel electrode, wherein the pixel defining layer may include a light blocking material.

According to some embodiments, a display panel includes a substrate on which a first display element is, a first pixel circuit on the substrate and electrically connected to the first display element, the first pixel circuit including at least one thin-film transistor, an organic insulating layer covering the at least one thin-film transistor, and a first transparent connection electrode on the organic insulating layer and electrically connected to the first pixel circuit, wherein the first display element includes a first pixel electrode arranged on a same layer as the first transparent connection electrode.

According to some embodiments, the first pixel electrode may include a first layer and a second layer on the first layer, the first layer including a reflective material and the second layer including a transparent conductive material, and the first transparent connection electrode may include a transparent conductive material.

According to some embodiments, the first transparent connection electrode may cover one end of the first pixel electrode.

According to some embodiments, the organic insulating layer may be provided by sequentially stacking a first organic insulating layer, a second organic insulating layer, and a third organic insulating layer, and the first transparent connection electrode may be connected to a first connection electrode on the first organic insulating layer through a via hole.

According to some embodiments, the third organic insulating layer may include a siloxane-based organic material.

According to some embodiments, at least a portion of an edge of the first pixel electrode may have a round shape.

According to some embodiments, the display panel may further include a pixel defining layer having an opening exposing a center of the first pixel electrode and covering an edge of the first pixel electrode, wherein the pixel defining layer may include a light blocking material.

According to some embodiments, a method of manufacturing a display panel includes forming a first pixel circuit including at least one thin-film transistor on a substrate, forming a first organic insulating layer covering the at least one thin-film transistor, forming a second connection electrode on the first organic insulating layer, forming a second organic insulating layer and a third organic insulating layer covering the second connection electrode and having a via hole exposing a portion of the second connection electrode, forming a second transparent connection electrode on the third organic insulating layer and connected to the second connection electrode through the via hole, and forming a second pixel electrode on the third organic insulating layer and covering one end of the second transparent connection electrode.

According to some embodiments, the second pixel electrode may include a reflective material.

According to some embodiments, the second pixel electrode may include a first layer and a second layer on the first layer, the first layer including a reflective material and the second layer including a transparent conductive material.

According to some embodiments, at least a portion of an edge of the second pixel electrode may have a round shape.

According to some embodiments, the method may further include forming a pixel defining layer having an opening exposing a center of the second pixel electrode and covering an edge of the second pixel electrode, wherein the pixel defining layer includes a light blocking material.

BRIEF DESCRIPTION OF THE DRAWINGS

The above and other aspects, features, and characteristics of certain embodiments of the disclosure will be more apparent from the following description taken in conjunction with the accompanying drawings, in which:

FIG. 8 is a schematic cross-sectional view illustrating a portion of a display panel, according to some embodiments;

FIG. 9 is a schematic cross-sectional view illustrating a portion of a display panel, according to some embodiments;

DETAILED DESCRIPTION

Figure 1:
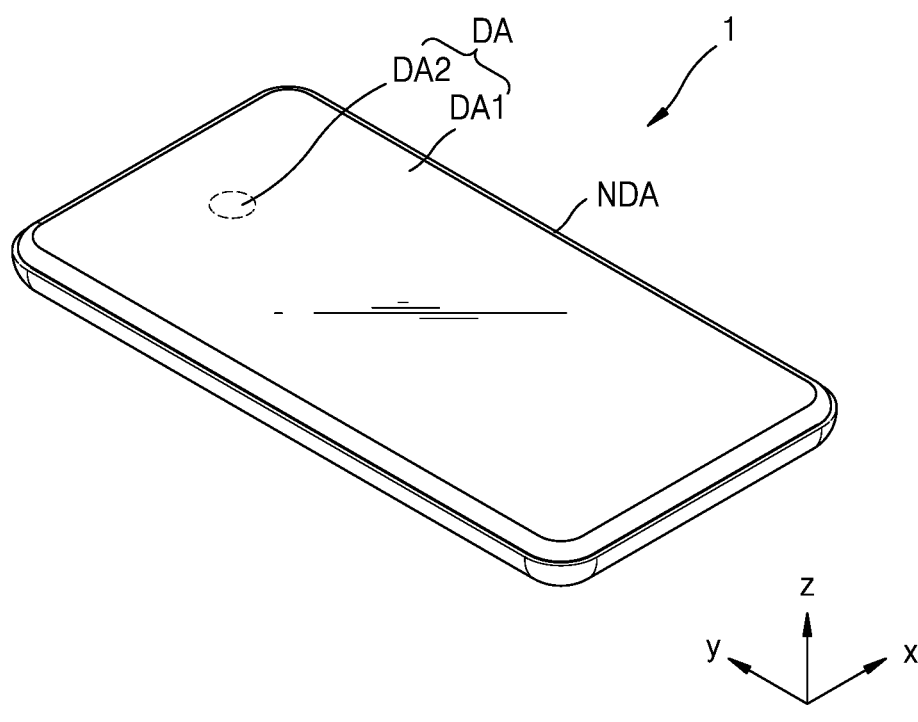
FIG. 1 is a perspective view illustrating an electronic apparatus according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

Hereinafter, aspects of some embodiments will be described in more detail with reference to the accompanying drawings. When describing embodiments with reference to the accompanying drawings, the same or corresponding elements are denoted by the same reference numerals.

It will be understood that although the terms "first," "second" etc. may be used herein to describe various elements, these elements should not be limited by these terms. These terms are only used to distinguish one element from another.

The singular forms "a," "an," and "the" as used herein are intended to include the plural forms as well unless the context clearly indicates otherwise.

It will be further understood that the terms "include" and/or "comprise" used herein specify the presence of stated features or elements, but do not preclude the presence or addition of one or more other features or elements.

It will be further understood that, when a layer, region, or element is referred to as being "on" another layer, region, or element, it may be directly or indirectly on the other layer, region, or element. That is, for example, intervening layers, regions, or elements may be present.

In the following embodiments, the expression "at least one of A and B" indicates only A, only B, or both A and B.

Also, sizes of elements in the drawings may be exaggerated or reduced for convenience of explanation. For example, because sizes and thicknesses of elements in the drawings are arbitrarily illustrated for convenience of explanation, the disclosure is not limited thereto.

When a certain embodiment may be implemented differently, a specific process order may be performed differently from the described order. For example, two consecutively described processes may be performed substantially at the same time or performed in an order opposite to the described order.

It will be further understood that, when layers, regions, or elements are referred to as being connected to each other, they may be directly connected to each other or indirectly connected to each other with intervening layers, regions, or elements therebetween. For example, when layers, regions, or elements are referred to as being electrically connected to each other, they may be directly electrically connected to each other or indirectly electrically connected to each other with intervening layers, regions, or elements therebetween.

FIG. 1 is a perspective view illustrating an electronic apparatus 1 according to some embodiments.

The electronic apparatus 1 according to some embodiments is configured to display a moving (e.g., video) image or a still (e.g., static) image. The electronic apparatus 1 may be used as display screens of portable electronic apparatuses, such as mobile phones, smartphones, tablet personal computers (PCs), mobile communication terminals, electronic organizers, e-books, portable multimedia players (PMPs), navigations, and ultra mobile PCs (UMPCs). Also, the electronic apparatus 1 may be used as display screens of various products, such as televisions, laptops, monitors, billboards, and Internet of things (IoT) devices. Also, the electronic apparatus 1 according to some embodiments may be used in wearable devices, such as smart watches, watch phones, glass-type displays, and head mounted displays (HMDs). Also, the electronic apparatus 1 according to some embodiments may be used in dashboards of automobiles, center information displays (CIDs) on the center fascia or dashboards of automobiles, room mirror displays replacing side mirrors of automobiles, and displays on the rear sides of front seats to serve as entertainment devices for backseat passengers of automobiles. For convenience of description, FIG. 1 illustrates that the electronic apparatus 1 is used as a smartphone.

Referring to FIG. 1, the electronic apparatus 1 may include a display area DA and a non-display area NDA outside (e.g., outside a footprint or in a periphery of) the display area DA. The electronic apparatus 1 may provide an image through an array of pixels that are two-dimensionally arranged in the display area DA.

The non-display area NDA is an area that does not provide or display images and may completely surround the display area DA. A driver or the like that provides electrical signals or power to display elements arranged in the display area DA may be arranged in the non-display area NDA. A pad, which is an area to which an electronic element or a printed circuit board may be electrically connected, may be arranged in the non-display area NDA.

The display area DA may include a first display area DA1 and a second display area DA2. The second display area DA2 is an area in which components for adding various functions to the electronic apparatus 1 are arranged, and the second display area DA2 may correspond to a component area. As illustrated in FIG. 1, the second display area DA2 may be arranged inside the first display area DA1 and surrounded by the first display area DA1. According to some embodiments, the second display area DA2 may be arranged on one side of the first display area DA1 and may be arranged between the first display area DA1 and the non-display area NDA. A plurality of second display areas DA2 may be provided. In this case, components may be respectively arranged to correspond to the second display areas DA2.

Figure 2:
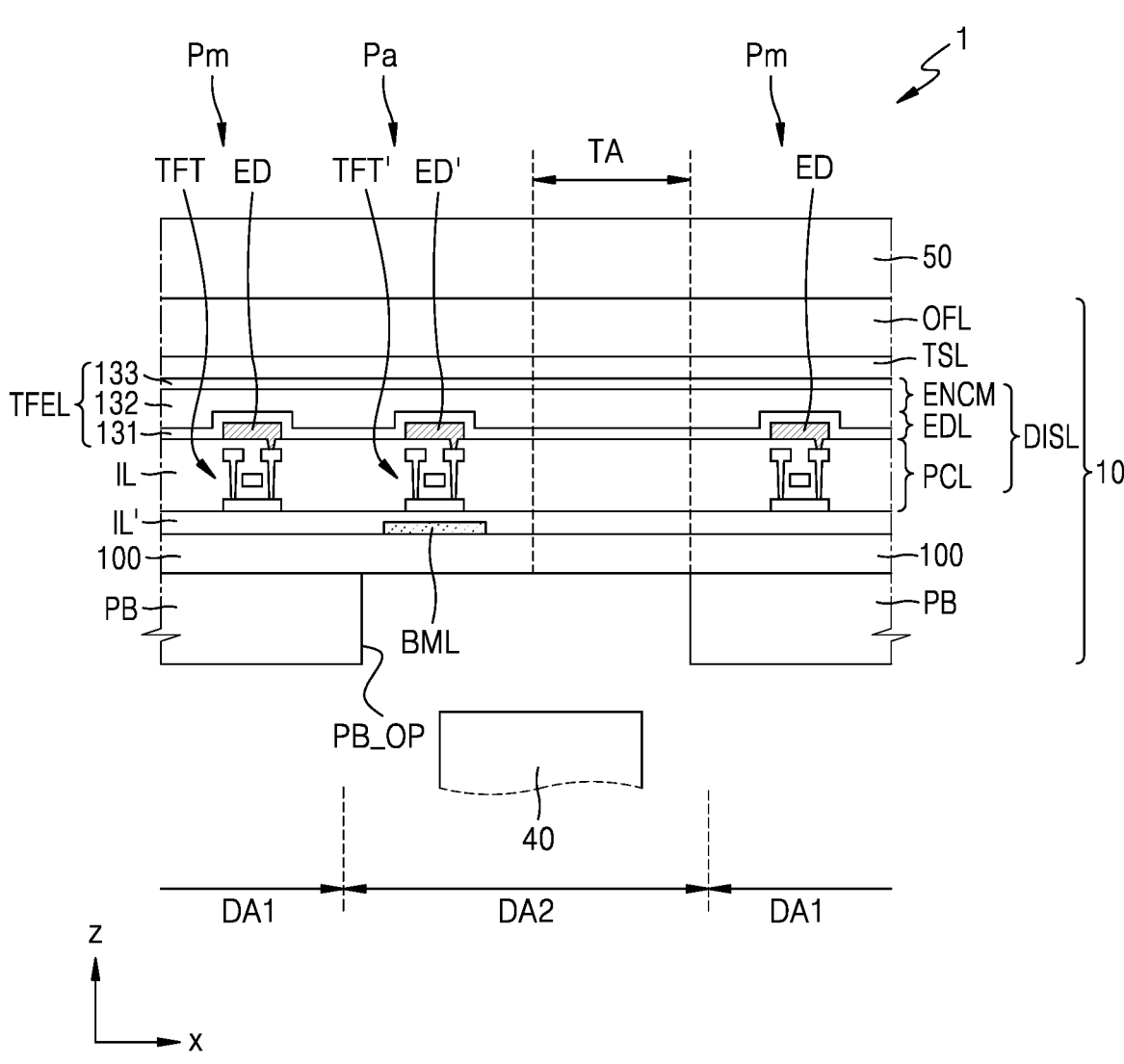
FIG. 2 is a cross-sectional view schematically illustrating a portion of a cross-section of an electronic apparatus, according to some embodiments.

FIG. 2 is a cross-sectional view schematically illustrating a portion of a cross-section of an electronic apparatus 1, according to some embodiments. For example, FIG. 2 illustrates a portion in which first display areas DA1 are arranged on both sides of a second display area DA2.

Referring to FIG. 2, the electronic apparatus 1 may include a display panel and a component 40 located under the display panel 10 to overlap the display panel 10. The component 40 may overlap the second display area DA2. The electronic apparatus 1 may further include a cover window 50 located on the display panel 10 to protect the display panel 10.

The display panel 10 includes the second display area DA2 which overlaps the component 40, and the first display areas DA1 on which a main image is displayed. The display panel 10 may include a substrate 100, a display layer DISL, a touch screen layer TSL, an optical function layer OFL, and a panel protection member PB. The display layer DISL, the touch screen layer TSL, and the optical function layer OFL may be located on the substrate 100, and the panel protection member PB may be located under the substrate 100.

The display layer DISL may include a circuit layer PCL including first and second thin-film transistors TFT and TFT', a display element layer including a main light-emitting device ED and an auxiliary light-emitting device ED' as a display element, and an encapsulation member ENCM, such as a thin-film encapsulation layer TFEL or an encapsulation substrate. Insulating layers IL and IL' may be arranged between the substrate 100 and the display layer DISL and may be arranged in the display layer DISL.

The substrate 100 may include an insulating material, such as a polymer resin. The substrate 100 may be a bendable, foldable, rollable, flexible substrate. The substrate 100 may have a multilayer structure including an inorganic layer and a layer including a polymer resin.

The first thin-film transistor TFT and the main light-emitting device ED connected thereto may be arranged in the first display area DA1 of the display panel to implement a main sub-pixel Pm, and the second thin-film transistor TFT' and the auxiliary light-emitting device ED' connected thereto may be arranged in the second display area DA2 to implement an auxiliary sub-pixel Pa.

The main light-emitting device ED and the auxiliary light-emitting device ED' may be organic light-emitting diodes including an organic material. The organic light-emitting diode may emit red light, green light, or blue light. The first and second light-emitting devices ED and ED' may each be an inorganic light-emitting diode including an inorganic material. The inorganic light-emitting diode may include a PN junction diode including inorganic semiconductor-based materials. When a voltage is applied to the PN junction diode in a forward direction, holes and electrons are injected and recombined to generate energy, and the energy is converted into light energy to emit light of a certain color. The inorganic light-emitting diode may have a width of several to several hundred micrometers or several to several hundred nanometers. In some embodiments, the first and second light-emitting devices ED and ED' may each include a quantum dot light-emitting diode. Emission layers of the first and second light-emitting devices ED and ED' may each include an organic material, an inorganic material, quantum dots, an organic material and quantum dots, or an inorganic material and quantum dots.

A transmission area TA in which no display element is arranged may be arranged in the second display area DA2. The transmission area TA may be an area through which light or a signal emitted from the component 40 arranged to correspond to the second display area DA2 or light or a signal incident on the component 40 may be transmitted. In the display panel 10, the transmittance of the transmission area TA may be about 30% or more, about 40% or more, about 50% or more, about 60% or more, about 70% or more, about 75% or more, about 80% or more, about 85% or more, or about 90% or more.

The component 40 may include a camera (or an image sensor) and a sensor, such as a proximity sensor, an illumination sensor, an iris sensor, or a facial recognition sensor. The component 40 may use light. For example, the component 40 may emit and/or receive light in infrared, ultraviolet, and visible light bands. The proximity sensor using infrared light may detect an object located close to the upper surface of the electronic apparatus 1, and the illumination sensor may detect the brightness of light incident on the upper surface of the electronic apparatus 1. Also, the iris sensor may photograph an iris of a person located above the electronic apparatus 1, and the camera may receive light related to an object located above the electronic apparatus 1.

A bottom metal layer BML may be arranged in the second display area DA2. The bottom metal layer BML may be arranged to correspond to the lower portion of the second thin-film transistor TFT'. For example, the bottom metal layer BML may be between the second thin-film transistor TFT' and the substrate 100. The bottom metal layer BML may prevent or reduce external light reaching the second thin-film transistor TFT'. According to some embodiments, a constant voltage or a signal may be applied to the bottom metal layer BML to prevent or reduce damage to the pixel circuit due to electrostatic discharge.

The display element layer EDL may be covered with the thin-film encapsulation layer TFEL or the encapsulation substrate. In some embodiments, the thin-film encapsulation layer TFEL may include at least one inorganic encapsulation layer and at least one organic encapsulation layer, as illustrated in FIG. 2. According to some embodiments, the thin-film encapsulation layer TFEL may include first and second inorganic encapsulation layers 131 and 133 and an organic encapsulation layer 132 therebetween.

The first and second inorganic encapsulation layers 131 and 133 may include at least one inorganic insulating material selected from silicon oxide, silicon nitride, and silicon oxynitride. The organic encapsulation layer 340 may include a polymer-based material. The polymer-based material may include an acrylic resin, an epoxy resin, polyimide, polyethylene, and the like.

When the display element layer EDL is sealed with the encapsulation substrate, the encapsulation substrate may be arranged to face the substrate 100 with the display element layer EDL therebetween. A gap may exist between the encapsulation substrate and the display element layer EDL. The encapsulation substrate may include glass. A sealant including frit or the like may be between the substrate 100 and the encapsulation substrate, and the sealant may be arranged in the non-display area NDA described above. The sealant arranged in the non-display area NDA may prevent or reduce instances of moisture or other contaminants penetrating through the side surface of the electronic apparatus 1 while surrounding the display area DA.

The touch screen layer TSL may be configured to obtain coordinate information according to an external input, for example, a touch event. The touch screen layer TSL may include touch electrodes and touch lines connected to the touch electrodes. The touch screen layer TSL may sense an external input by using a self-capacitance method or a mutual capacitance method.

The touch screen layer TSL may be located on the thin-film encapsulation layer TFEL. Alternatively, the touch screen layer TSL may be separately formed on a touch substrate and then connected to the thin-film encapsulation layer TFEL through an adhesive layer, such as an optically clear adhesive. According to some embodiments, the touch screen layer TSL may be formed directly on the thin-film encapsulation layer TFEL. In this case, the adhesive layer may not be formed or utilized between the touch screen layer TSL and the thin-film encapsulation layer TFEL.

The optical function layer OFL may be introduced in order to improve visibility. The optical function layer OFL may include, for example, an anti-reflection layer. The anti-reflection layer may reduce the reflectance of light (external light) incident from the outside toward the electronic apparatus 1.

According to some embodiments, the anti-reflection layer may include a polarizing film. In some embodiments, the anti-reflection layer may include a filter layer including a black matrix and color filters. The color filters may be arranged considering the color of light emitted from each pixel of the electronic apparatus 1. For example, the color filters may include a red, green, or blue color filter.

According to some embodiments, the anti-reflection layer may include a destructive interference structure. The destructive interference structure may include a first reflective layer and a second reflective layer located on different layers from each other. First reflected light and second reflected light respectively reflected from the first reflective layer and the second reflective layer may destructively interfere with each other, and thus, the reflectance of external light may be reduced.

The cover window 50 may be located on the display panel 10 to protect the display panel 10. The cover window 50 may include a glass material or a plastic material. The glass material may include ultra-thin glass. The plastic material may include polyethersulfone, polyacrylate, polyether imide, polyethylene naphthalate, polyethylene terephthalate, polyphenylene sulfide, polyarylate, polyimide, polycarbonate, or cellulose acetate propionate. The optical function layer OFL may be bonded to the cover window with an optically clear adhesive, or may be bonded to the touch screen layer TSL with an optically clear adhesive.

The panel protection member PB may be bonded to the lower portion of the substrate 100 to support and protect the substrate 100. The panel protection member PB may include an opening PB_OP corresponding to the second display area DA2. By providing the opening PB_OP in the panel protection member PB, the light transmittance of the second display area DA2 may be improved. The panel protection cover PB may include polyethylene terephthalate (PET) or polyimide (PI).

The area of the second display area DA2 may be greater than the area in which the component 40 is arranged. Accordingly, the area of the opening PB_OP provided in the panel protection member PB may not coincide with the area of the second display area DA2.

Also, a plurality of components 40 may be arranged in the second display area DA2. The components 40 may have different functions from each other. For example, the components 40 may include at least two of a camera (imaging device), a solar cell, a flash, a proximity sensor, an illumination sensor, and an iris sensor.

Figure 3:
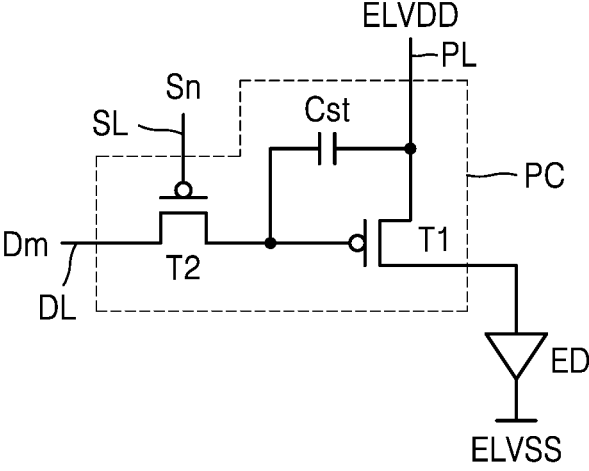
FIG. 3 is an equivalent circuit diagram of a pixel circuit configured to drive a sub-pixel, according to some embodiments.

FIG. 3 is an equivalent circuit diagram of a pixel circuit PC configured to drive a sub-pixel, according to some embodiments.

Referring to FIG. 3, the pixel circuit PC may be connected to a light-emitting device ED to implement light emission of sub-pixels. The pixel circuit PC includes a driving thin-film transistor T1, a switching thin-film transistor T2, and a storage capacitor Cst. The switching thin-film transistor T2 is connected to a scan line SL and a data line DL, and may be configured to transmit, to the driving thin-film transistor T1, a data signal Dm input through the data line DL in response to a scan signal Sn input through the scan line SL.

The storage capacitor Cst is connected to the switching thin-film transistor T2 and a driving voltage line PL, and may be configured to store a voltage corresponding to a difference between a voltage received from the switching thin-film transistor T2 and a driving voltage ELVDD supplied to the driving voltage line PL.

The driving thin-film transistor T1 may be connected to the driving voltage line PL and the storage capacitor Cst, and may be configured to control a driving current flowing from the driving voltage line PL to the light-emitting device ED according to a voltage value stored in the storage capacitor Cst. The light-emitting device ED may emit light having a certain luminance according to the driving current.

Although FIG. 3 illustrates that the circuit PC includes two thin-film transistors and one storage capacitor, embodiments according to the present disclosure are not limited thereto. The pixel circuit PC, however, may be variously modified. For example, the pixel circuit PC may include three or more thin-film transistors and/or two or more storage capacitors. That is, in various embodiments, the pixel circuit PC may include additional components, or fewer components, without departing from the spirit and scope of embodiments according to the present disclosure.

Figure 4:
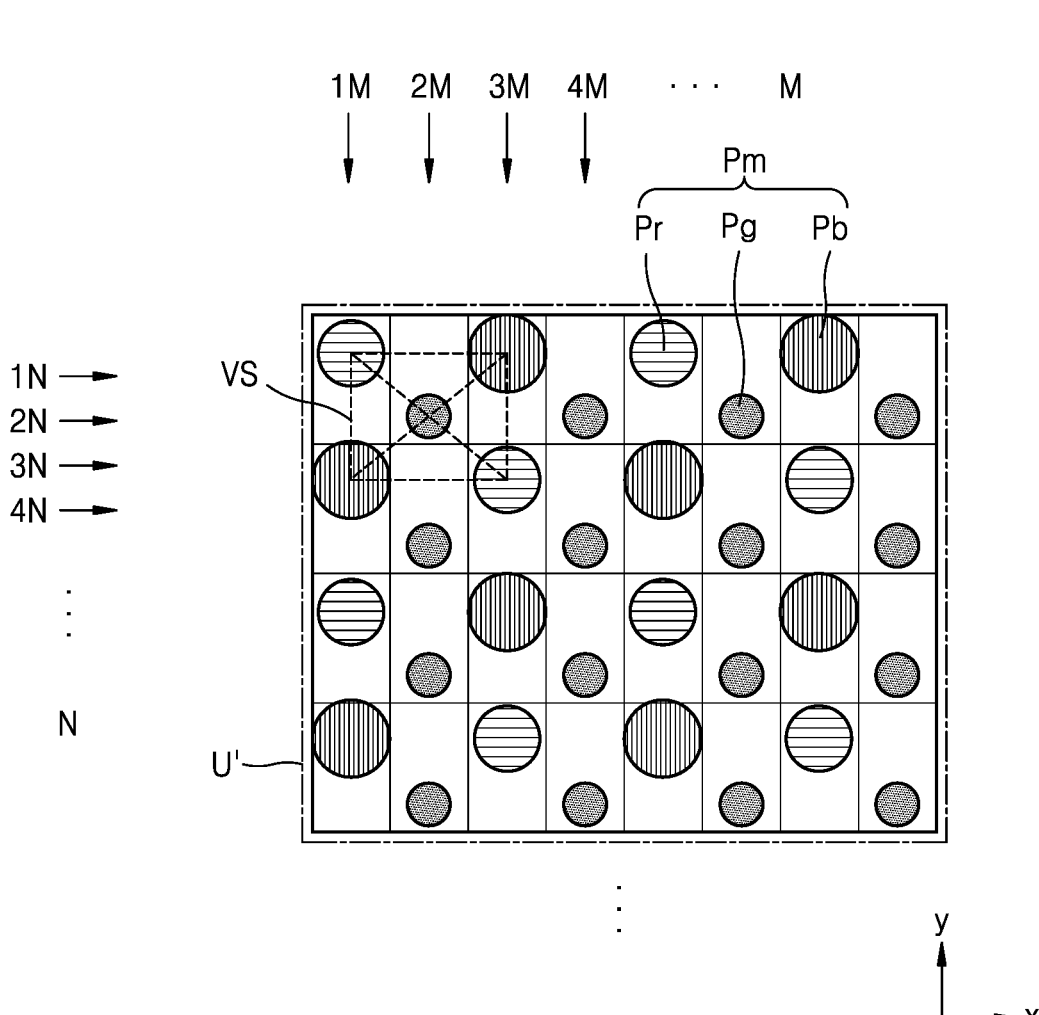
FIG. 4 is a layout diagram schematically illustrating a pixel arrangement structure in a first display area, according to some embodiments.

FIG. 4 is a layout diagram schematically illustrating a pixel arrangement structure in a first display area DA1, according to some embodiments.

A plurality of main sub-pixels Pm may be arranged in the first display area DA1. In the present specification, the sub-pixel is a minimum unit for implementing an image and refers to an emission area. On the other hand, when an organic light-emitting diode is employed as a display element, the emission area may be defined by an opening of a pixel defining layer. This will be described in more detail below.

As illustrated in FIG. 4, the main sub-pixels Pm in the first display area DA1 may be arranged in a PenTile™ structure. The main sub-pixels Pm may include a first sub-pixel Pr, a second sub-pixel Pg, and a third sub-pixel Pb, which may implement red, green, and blue, respectively.

In a first row 1N, first sub-pixels Pr and third sub-pixels Pb are alternately arranged. In a second row 2N adjacent to the first row 1N, second sub-pixels Pg are apart from each other at certain intervals. In a third row 3N adjacent to the second row 2N, third sub-pixels Pb and first sub-pixels Pr are alternately arranged. In a fourth row 4N adjacent to the third row 3N, second sub-pixels Pg are apart from each other at certain intervals. Such a pixel arrangement is repeated up to an $N^{th}$ row. In this case, the third sub-pixel Pb and the first sub-pixel Pr may be greater than the second sub-pixel Pg.

The first sub-pixels Pr and the third sub-pixels Pb in the first row 1N may be misaligned with the second sub-pixels Pg in the second row 2N. Therefore, in a first column 1M, the first sub-pixels Pr and the third sub-pixels Pb are alternately arranged. In a second column 2M adjacent to the first column 1M, the second sub-pixels Pg are apart from each other at certain intervals. In a third column 3M adjacent to the second column 2M, the third sub-pixels Pb and the first sub-pixels Pr are alternately arranged. In a fourth column 4M adjacent to the third column 3M, the second sub-pixels Pg are apart from each other at certain intervals. Such a pixel arrangement is repeated up to an $M^{th}$ column.

Such a pixel array structure is expressed differently as follows: in a virtual quadrangle VS having the center point of the second sub-pixel Pg as the center point of the virtual quadrangle VS, the first sub-pixels Pr are arranged at the first and third vertices of the virtual quadrangle VS facing each other, and the third sub-pixels Pb are arranged at the remaining second and fourth vertices of the virtual quadrangle VS. In this case, the virtual quadrangle VS may be variously modified into, for example, a rectangle, a rhombus, and a square.

Such a pixel array structure is called a PenTile™ matrix structure or a PenTile™ structure, and may implement high resolution with a small number of pixels by applying a rendering driving that shares adjacent pixels to express colors.

FIG. 4 illustrates that the main sub-pixels Pm are arranged in a PenTile™ matrix structure, but the disclosure is not limited thereto. For example, the main sub-pixels Pm may be arranged in various forms, for example, a stripe structure, a mosaic array structure, and a delta array structure.

Figure 5:
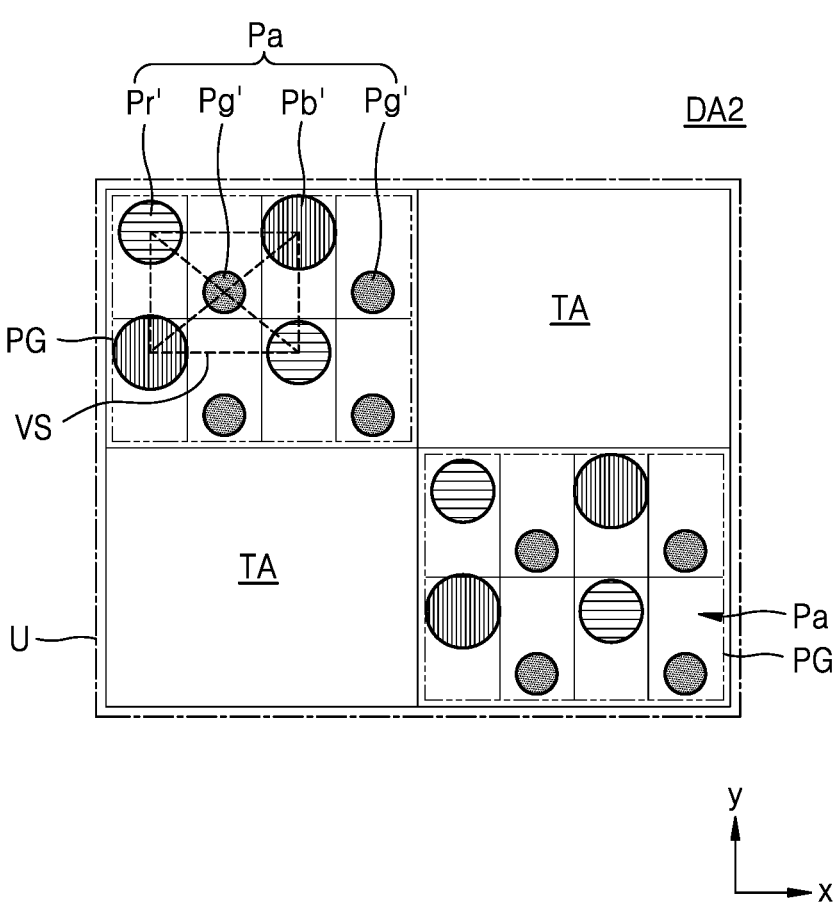
FIG. 5 is a layout diagram schematically illustrating a pixel arrangement structure in a second display area, according to some embodiments.

FIG. 5 is a layout diagram schematically illustrating a pixel arrangement structure in a second display area DA2, according to some embodiments.

Referring to FIG. 5, a plurality of auxiliary sub-pixels Pa may be arranged in the second display area DA2. The auxiliary sub-pixels Pa may each emit one of red light, green light, blue light, and white light.

The second display area DA2 may have a pixel group PG including at least one auxiliary sub-pixel Pa and a transmission area TA. The pixel group PG and the transmission area TA are alternately arranged in the x-direction and the y-direction, and may be arranged in, for example, a grid shape. In this case, the second display area DA2 may have a plurality of pixel groups PG and a plurality of transmission areas TA.

The pixel group PG may be defined as a sub-pixel assembly in which a plurality of auxiliary sub-pixels Pa are grouped into a preset unit. For example, as illustrated in FIG. 5, one pixel group PG may include eight auxiliary sub-pixels Pa arranged in a Pentile™ structure. That is, one pixel group PG may include two first sub-pixels Pr', four second sub-pixels Pg', and two third sub-pixels Pb'.

In the second display area DA2, a basic unit U in which a certain number of pixel groups PG and a certain number of transmission areas TA are grouped may be repeatedly arranged in the x-direction and the y-direction. In FIG. 5, the basic unit U may have a shape in which two pixel groups PG and two transmission areas TA arranged around the two pixel groups PG are grouped into a rectangle. The basic unit U is a division of a repetitive shape, and does not mean a discontinuity in structure.

A corresponding unit U' having the same area as the area of the basic unit U may be set in the first display area DA1. In this case, the number of main sub-pixels Pm included in the corresponding unit U' may be greater than the number of auxiliary sub-pixels Pa included in the basic unit U. 16 auxiliary sub-pixels Pa may be included in the basic unit U, and 32 main sub-pixels Pm may be included in the corresponding unit U'. That is, a ratio of the number of auxiliary sub-pixels Pa to the number of main sub-pixels Pm may be 1:2 in the same area.

The pixel arrangement structure of the second display area DA2 in which the auxiliary sub-pixels Pa are arranged in Pentile™ structure, as illustrated in FIG. 5, and the resolution of the second display area DA2 is half the resolution of the first display area DA1 is called a ½ Pentile™ structure. The design in the number or arrangement of the auxiliary sub-pixels Pa included in the pixel group PG may be modified according to the resolution of the second display area DA2.

Figure 6:
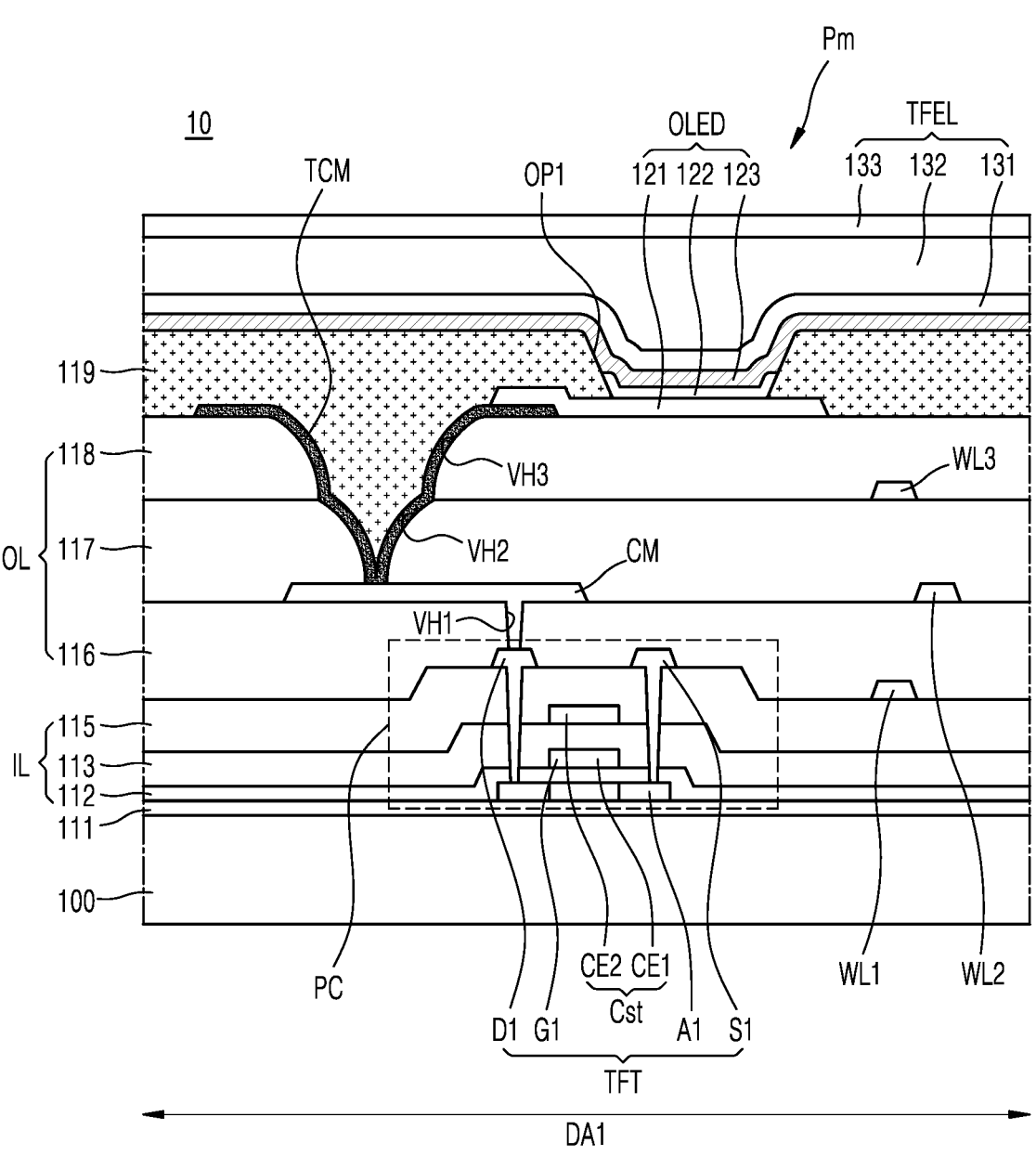
FIG. 6 is a schematic cross-sectional view illustrating a portion of a display panel, according to some embodiments.
Figure 7:
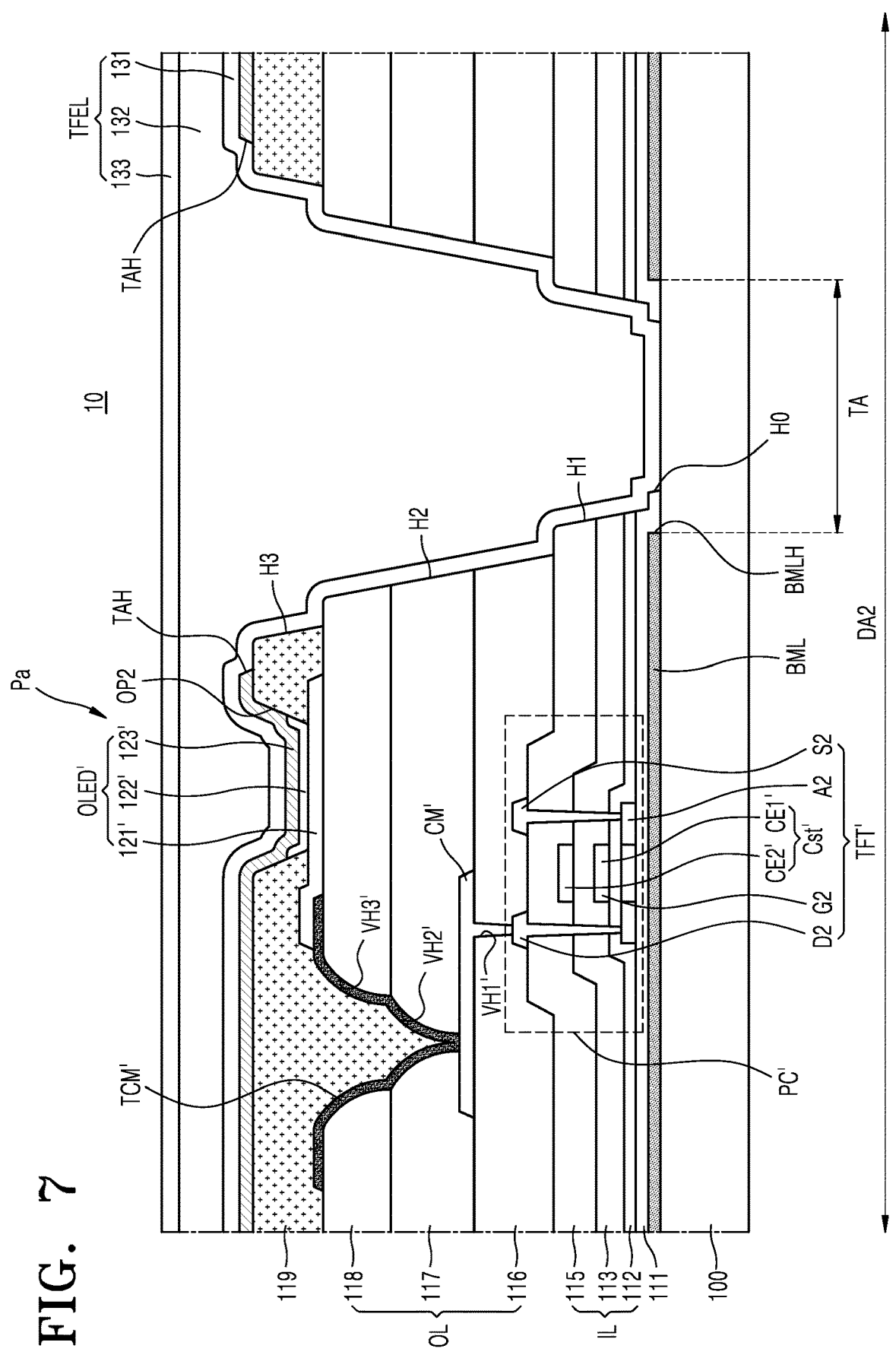
FIG. 7 is a schematic cross-sectional view illustrating a portion of a display panel, according to some embodiments.

FIGS. 6 and 7 are schematic cross-sectional views illustrating a portion of a display panel 10, according to some embodiments. For example, FIG. 6 is a cross-sectional view schematically illustrating a portion of a first display area DA1, and FIG. 7 is a cross-sectional view schematically illustrating a portion of a second display area DA2.

Referring to FIGS. 6 and 7, the display panel 10 includes the first display area DA1 and the second display area DA2. A main sub-pixel Pm is arranged in the first display area DA1, and an auxiliary sub-pixel Pa is arranged in the second display area DA2. The second display area DA2 has a transmission area TA. A main pixel circuit PC and a first organic light-emitting diode OLED may be arranged in the first display area DA1. The main pixel circuit PC includes a first thin-film transistor TFT and a first storage capacitor Cst. The first organic light-emitting diode OLED is a display element connected to the main pixel circuit PC. An auxiliary pixel circuit PC' and a second organic light-emitting diode OLED' may be arranged in the second display area DA2. The auxiliary pixel circuit PC' includes a second thin-film transistor TFT' and a second storage capacitor Cst'. The second organic light-emitting diode OLED' is a display element connected to the auxiliary pixel circuit PC'.

According to some embodiments, the case where the organic light-emitting diode is employed as the display element is described as an example, but according to some embodiments, an inorganic light-emitting device or a quantum dot light-emitting device may be employed as the display element.

Hereinafter, a structure in which elements included in the display panel 10 are stacked will be described in more detail. The display panel 10 may be provided by stacking a substrate 100, a buffer layer 111, pixel circuits PC and PC', organic light-emitting diodes OLED and OLED', and a thin-film encapsulation layer TFEL.

The substrate 100 may include an insulating material, such as a polymer resin. The substrate 100 may be a bendable, foldable, rollable, flexible substrate. The substrate 100 may include a structure in which an organic material, an inorganic material, and an organic material are stacked.

The buffer layer 111 may be located on the substrate 100 to reduce or prevent infiltration of foreign material, moisture, or ambient air from below the substrate 100, and may provide a flat surface on the substrate 100. The buffer layer 111 may include an inorganic material, such as an oxide or a nitride, an organic material, or an organic/inorganic composite material, and may have a single-layer or multilayer structure including an inorganic material and an organic material. A barrier layer that prevents or reduces infiltration of ambient air may be further included between the substrate 100 and the buffer layer 111. According to some embodiments, the buffer layer 111 may include silicon oxide ($SiO_x$) or silicon nitride ($SiN_x$). According to some embodiments, the buffer layer 111 may be provided by stacking silicon oxide ($SiO_x$) and silicon nitride ($SiN_x$).

In the second display area DA2, a bottom metal layer BML may be between the substrate 100 and the buffer layer 111. The bottom metal layer BML is located under the auxiliary pixel circuit PC' to prevent or reduce characteristics of the second thin-film transistor TFT' from being deteriorated due to light emitted from a component or the like. Also, the bottom metal layer BML may prevent or reduce light emitted from or directed to the component or the like diffracting through a narrow gap between wirings connected to the auxiliary pixel circuit PC'. The bottom metal layer BML may include a lower hole BMLH corresponding to the transmission area TA.

A bias voltage may be applied to the bottom metal layer BML. Because the bias voltage is applied to the bottom metal layer BML, the bottom metal layer BML may significantly reduce the probability that electrostatic discharge will occur. The bottom metal layer BML may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). The bottom metal layer BML may include a single layer or layers including the material described above.

The pixel circuits PC and PC' may be located on the buffer layer 111. The main pixel circuit PC may include the first thin-film transistor TFT and the first storage capacitor Cst, and the auxiliary pixel circuit PC' may include the second thin-film transistor TFT' and the second storage capacitor Cst'.

The first thin-film transistor TFT and the second thin-film transistor TFT' may be located on the buffer layer 111. The first thin-film transistor TFT includes a first semiconductor layer A1, a first gate electrode G1, a first source electrode S1, and a first drain electrode D1, and the second thin-film transistor TFT includes a second semiconductor layer A2, a second gate electrode G2, a second source electrode S2, and a second drain electrode D2. The first thin-film transistor TFT may be connected to the first organic light-emitting diode OLED and configured to drive the first organic light-emitting diode OLED. The second thin-film transistor TFT' may be connected to the second organic light-emitting diode OLED' and configured to drive the second organic light-emitting diode OLED'.

The first semiconductor layer A1 and the second semiconductor layer A2 may be located on the buffer layer 111, and may include polysilicon. According to some embodiments, the first semiconductor layer A1 and the second semiconductor layer A2 may include amorphous silicon. According to some embodiments, the first semiconductor layer A1 and the second semiconductor layer A2 may include an oxide of at least one selected from indium (In), gallium (Ga), stannum (Sn), zirconium (Zr), vanadium (V), hafnium (Hf), cadmium (Cd), germanium (Ge), chromium (Cr), titanium (Ti), and zinc (Zn). The first semiconductor layer A1 and the second semiconductor layer A2 may each include a channel region, and a source region and a drain region doped with impurities.

The second semiconductor layer A2 may overlap the bottom metal layer BML with the buffer layer 111 therebetween. According to some embodiments, the width of the second semiconductor layer A2 may be less than the width of the bottom metal layer BML. Accordingly, when projected in a direction perpendicular to the substrate 100, the second semiconductor layer A2 may completely overlap the bottom metal layer BML.

A first gate insulating layer 112 may be provided to cover the first semiconductor layer A1 and the second semiconductor layer A2. The first gate insulating layer 112 may include an inorganic insulating material, such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), or hafnium oxide ($HfO_2$). The first gate insulating layer 112 may include a single layer or layers including the inorganic insulating material described above.

The first gate electrode G1 and the second gate electrode G2 are located on the first gate insulating layer 112 to overlap the first semiconductor layer A1 and the second semiconductor layer A2, respectively. The first gate electrode G1 and the second gate electrode G2 may include molybdenum (Mo), aluminum (Al), copper (Cu), titanium (Ti), and the like, and may include a single layer or layers. For example, the first gate electrode G1 and the second gate electrode G2 may each be a single Mo layer.

The second gate insulating layer 113 may cover the first gate electrode G1 and the second gate electrode G2. The second gate insulating layer 113 may include an inorganic insulating material, such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), or hafnium oxide ($HfO_2$). The second gate insulating layer 113 may include a single layer or layers including the inorganic insulating material described above.

A first upper electrode CE2 of the first storage capacitor Cst and a second upper electrode CE2' of the second storage capacitor Cst' may be located above the second gate insulating layer 113.

In the first display area DA1, the first upper electrode CE2 may overlap the first gate electrode G1 therebelow. The first gate electrode G1 and the first upper electrode CE2 overlapping each other with the second gate insulating layer 113 therebetween may constitute the first storage capacitor Cst. The first gate electrode G1 may be the first lower electrode CE1 of the first storage capacitor Cst.

In the second display area DA2, the second upper electrode CE2' may overlap the second gate electrode G2 therebelow. The second gate electrode G2 and the second upper electrode CE2' overlapping each other with the second gate insulating layer 113 therebetween may constitute the second storage capacitor Cst'.

The second gate electrode G2 may be the second lower electrode CE1' of the second storage capacitor Cst'.

The first upper electrode CE2 and the second upper electrode CE2' may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (Ti), and/or copper (Cu), and may include a single layer or layers including the material described above.

An interlayer insulating layer 115 may be arranged to cover the first upper electrode CE2 and the second upper electrode CE2'. The interlayer insulating layer 115 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$). The interlayer insulating layer 115 may include a single layer or layers including the inorganic insulating material described above.

When the first gate insulating layer 112, the second gate insulating layer 113, and the interlayer insulating layer 115 are collectively referred to as an inorganic insulating layer IL, the inorganic insulating layer IL may have a first hole H1 corresponding to the transmission area TA. The first hole H1 may expose a portion of the buffer layer 111 or the upper surface of the substrate 100. The first hole H1 may be defined by overlapping an opening of the first gate insulating layer 112, an opening of the second gate insulating layer 113, and an opening of the interlayer insulating layer 115, which are formed to correspond to the transmission area TA. These openings may be separately formed through separate processes, or may be simultaneously formed through the same process. When these openings are formed through separate processes, the inner surface of the first hole H1 may not be smooth and may have a step, such as a stair shape.

On the other hand, according to some embodiments, the buffer layer 111 may have a buffer hole H0 corresponding to the transmission area TA. The buffer hole H0 may expose a portion of the upper surface of the substrate 100. The area of the buffer hole H0 may be less than the area of the first hole H1. Because the buffer layer 111 and the inorganic insulating layer IL have the first hole H1 and the buffer hole H0 corresponding to the transmission area TA, the light transmittance of the second display area DA2 may be improved.

A first wiring WL1, the source electrodes S1 and S2, and the drain electrodes D1 and D2 may be located on the interlayer insulating layer 115. The first wiring WL1 may be configured to transmit a data signal or a driving voltage to the pixel circuit PC. The first wiring WL1, the source electrodes S1 and S2, and the drain electrodes D1 and D2 may include a conductive material including molybdenum (Mo), aluminum (Al), copper (Cu), titanium (Ti), and the like, and may include a single layer or layers including the conductive material described above. For example, the first wiring WL1, the source electrode S1 and S2, and the drain electrodes D1 and D2 may have a multilayer structure of Ti/Al/Ti.

An organic insulating layer OL may be arranged to cover the first thin-film transistor TFT and the second thin-film transistor TFT'. The organic insulating layer OL may include a single layer or layers. For example, the organic insulating layer OL may be provided by stacking a first organic insulating layer 116, a second organic insulating layer 117, and a third organic insulating layer 118. In this case, a second wiring WL2 may be located on the first organic insulating layer 116, and a third wiring WL3 may be located on the second organic insulating layer 117. The second wiring WL2 and the third wiring WL3 may be configured to transmit various signals and/or voltages to the pixel circuits PC and PC'.

The first organic insulating layer 116 may be arranged to cover the first wiring WL1, the source electrodes S1 and S2, and the drain electrodes D1 and D2. The first organic insulating layer 116 may include general-purpose polymer (e.g., photosensitive polyimide, polyimide, polystyrene (PS), polycarbonate (PC), benzocyclobutene (BCB), hexamethyldisiloxane (HMDSO), or polymethylmethacrylate (PMMA)), polymer derivatives having a phenolic group, acrylic polymer, imide-based polymer, aryl ether-based polymer, amide-based polymer, fluorine-based polymer, p-xylene-based polymer, or vinyl alcohol-based polymer.

Connection electrodes CM and CM' and the second wiring WL2 may be located on the first organic insulating layer 116. The connection electrodes CM and CM' may be members that electrically connect the pixel circuits PC and PC' to the organic light-emitting diodes OLED and OLED'. The connection electrodes CM and CM' may be connected to one or more thin-film transistor TFT and TFT' through via holes VH1 and VH1' passing through the first organic insulating layer 116. The second wiring WL2 may overlap the first wiring WL1. As the second wiring WL2 is provided, the display panel may be highly integrated.

The connection electrodes CM and CM' and the second wiring WL2 may include a conductive material including molybdenum (Mo), aluminum (Al), copper (Cu), titanium (Ti), and the like, and may include a single layer or layers including the conductive material described above.

The second organic insulating layer 117 may be arranged to cover the connection electrodes CM and CM' and the second wiring WL2. The second organic insulating layer 117 may include the same material as that of the first organic insulating layer 116. The second organic insulating layer 117 may include general-purpose polymer (e.g., photosensitive polyimide, polyimide, PS, PC, BCB, HMDSO, or PMMA), polymer derivatives having a phenolic group, acrylic polymer, imide-based polymer, aryl ether-based polymer, amide-based polymer, fluorine-based polymer, p-xylene-based polymer, or vinyl alcohol-based polymer.

The third wiring WL3 may be located on the second organic insulating layer 117. The third wiring WL3 may include the same material as that of the first wiring WL1 and/or the second wiring WL2, and may overlap the first wiring WL1 and/or the second wiring WL2.

The third organic insulating layer 118 may be located on the second organic insulating layer 117 to cover the third wiring WL3. The third organic insulating layer 118 may have a flat upper surface so that a first pixel electrode 121 and a second pixel electrode 121' located thereon are formed to be flat. A first transparent connection electrode TCM connected to the first pixel electrode 121 and a second transparent connection electrode TCM' connected to the second pixel electrode 121' may be located on the upper surface of the third organic insulating layer 118.

In some embodiments, the third organic insulating layer 118 may include a material that is different from a material of each of the first organic insulating layer 116 and the second organic insulating layer 117. The third organic insulating layer 118 may include an organic material having an upper surface flatness better than that of the first organic insulating layer 116 and the second organic insulating layer 117. For example, the third organic insulating layer 118 may include a siloxane-based organic material. The siloxane-based organic material may include hexamethyldisiloxane, octamethyltrisiloxane, decamethyltetrasiloxane, dodecamethylpentasiloxane, and polydimethylsiloxane.

According to some embodiments, the first organic insulating layer 116, the second organic insulating layer 117, and the third organic insulating layer 118 may all include the same material. For example, the first organic insulating layer 116, the second organic insulating layer 117, and the third organic insulating layer 118 may all include the siloxane-based organic material.

Because the third organic insulating layer 118 include an organic material having a high flatness, the first pixel electrode 121 and the second pixel electrode 121' located on the third organic insulating layer 118 may be provided to be flat. Therefore, interference between pieces of light reflected from the first pixel electrode 121 and the second pixel electrode 121' may be minimized.

On the other hand, the organic insulating layer OL may have a second hole H2 corresponding to the transmission area TA. The second hole H2 may be defined by overlapping an opening of the first organic insulating layer 116, an opening of the second organic insulating layer 117, and an opening of the third organic insulating layer 118, which are formed to correspond to the transmission area TA. These openings may be separately formed through separate processes, or may be simultaneously formed through the same process. When these openings are formed through separate processes, the inner surface of the second hole H2 may not be smooth and may have a step, such as a stair shape.

The second hole H2 may overlap the first hole H1. FIG. 7 illustrates that the second hole H2 is greater than the first hole H1. According to some embodiments, the organic insulating layer OL may be provided to cover the edge of the first hole H1 of the inorganic insulating layer IL, so that the area of the second hole H2 is less than the area of the first hole H1.

The first organic insulating layer 116 may have a via hole VH1 exposing one of the first source electrode S1 and the first drain electrode D1 of the first thin-film transistor TFT, and the first connection electrode CM may be in contact with the first source electrode S1 or the first drain electrode D1 through the via hole VH1 and electrically connected to the first thin-film transistor TFT. Also, the first organic insulating layer 116 may have a via hole VH1' exposing one of the second source electrode S2 and the second drain electrode D2 of the second thin-film transistor TFT', and the second connection electrode CM' may be in contact with the second source electrode S2 or the second drain electrode D2 through the via hole VH1' and electrically connected to the second thin-film transistor TFT'.

The second organic insulating layer 117 has a via hole VH2 exposing the first connection electrode CM, and the third organic insulating layer 118 has a via hole VH3 overlapping the via hole VH2. Therefore, the first transparent connection electrode TCM may be in contact with the first connection electrode CM through the via holes VH2 and VH3. Also, the second organic insulating layer 117 has a via hole VH2' exposing the second connection electrode CM', and the third organic insulating layer 118 has a via hole VH3' overlapping the via hole VH2'. Therefore, the second transparent connection electrode TCM' may be in contact with the second connection electrode CM' through the via holes VH2' and VH3'. Therefore, the first pixel electrode 121 may be electrically connected to the first thin-film transistor TFT through the first transparent connection electrode TCM and the first connection electrode CM, and the second pixel electrode 121' may be electrically connected to the second thin-film transistor TFT' through the second transparent connection electrode TCM' and the second connection electrode CM'.

The first transparent connection electrode TCM and the second transparent connection electrode TCM' may be arranged on the same layer as the first pixel electrode 121 and the second pixel electrode 121', and may include a transparent conductive oxide. That is, the first transparent connection electrode TCM and the second transparent connection electrode TCM' may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO).

The first transparent connection electrode TCM is a member electrically connected to the first pixel circuit PC. The first transparent connection electrode TCM may be a member that electrically connects the first pixel electrode 121 of the first organic light-emitting diode OLED to the first pixel circuit PC. The second transparent connection electrode TCM' is a member electrically connected to the second pixel circuit PC'. The second transparent connection electrode TCM' may be a member that electrically connects the second pixel electrode 121' of the second organic light-emitting diode OLED' to the second pixel circuit PC'.

The first transparent connection electrode TCM and the second transparent connection electrode TCM' may be introduced to reduce interference between pieces of light reflected from the first pixel electrode 121 and the second pixel electrode 121'. When a portion of the first pixel electrode 121 is in contact with the first connection electrode CM through the via holes VH2 and VH3, reflected light may also be generated in the via holes VH2 and VH3 by a reflective layer that may be included in the first pixel electrode 121. The reflected light causes light interference, and thus, reflective color bands may be visually recognized.

According to some embodiments, the visible recognition of the reflective color bands may be prevented or reduced by introducing the first transparent connection electrode TCM and the second transparent connection electrode TCM' to minimize reflected light that may be generated inside the via holes VH2 and VH3.

The first pixel electrode 121 and the second the pixel electrode 121' may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. Also, the first pixel electrode 121 and the second pixel electrode 121' may include a conductive oxide, such as ITO, IZO, ZnO, $In_2O_3$, IGO, or AZO. In this case, the first pixel electrode 121 and the second pixel electrode 121' may each have a structure in which a first layer provided as a reflective layer and a second layer including a conductive oxide are stacked in this order. For example, the first pixel electrode 121 and the second pixel electrode 121' may each have a stack structure of Ag/ITO.

The first pixel electrode 121 may be arranged on the same layer as the first transparent connection electrode TCM. Also, the first pixel electrode 121 may cover the edge of the first transparent connection electrode TCM and may be in contact with the first transparent connection electrode TCM. Similarly, the second pixel electrode 121' may be arranged on the same layer as the second transparent connection electrode TCM'. Also, the second pixel electrode 121' may cover the edge of the second transparent connection electrode TCM' and may be in contact with the second transparent connection electrode TCM'.

The pixel defining layer 119 may cover the edge of each of the first pixel electrode 121 and the second pixel electrode 121' on the organic insulating layer OL, and may include a first opening OP1 and a second opening OP2 respectively exposing the central portions of the first pixel electrode 121 and the second pixel electrode 121'. The size and shape of the emission areas of the organic light-emitting diodes OLED and OLED', that is, the main sub-pixel Pm and the auxiliary sub-pixel Pa, are defined by the first opening OP1 and the second opening OP2.

The pixel defining layer 119 may prevent or reduce instances of an electric arc or the like occurring on the edges of the pixel electrodes 121 and 121' by increasing the distance between the edges of the pixel electrodes 121 and 121' and an opposite electrode 123 on the pixel electrodes 121 and 121'. The pixel defining layer 119 may include an organic insulating material, such as polyimide, polyamide, acrylic resin, BCB, HMDSO, and phenol resin, and may be formed by spin coating.

In some embodiments, the pixel defining layer 119 may include a light blocking material. That is, the pixel defining layer 119 may include an insulating material (e.g., an organic insulating material) including a black pigment or dye. As described above, the pixel defining layer 119 provided as a light blocking layer may improve visibility by preventing or reducing color mixing between adjacent pixels.

The pixel defining layer 119 may include a third hole H3 in the transmission area TA. The third hole H3 may overlap the first hole H1 and the second hole H2. The light transmittance in the transmission area TA may be improved by the first to third holes H1 to H3. A portion of the opposite electrode 123 to be described below may be arranged on the inner surfaces of the first to third holes H1 to H3.

A first emission layer 122 and a second emission layer 122' respectively corresponding to the first pixel electrode 121 and the second pixel electrode 121' are arranged inside the first opening OP1 and the second opening OP2 of the pixel defining layer 119. The first emission layer 122 and the second emission layer 122' may include a high molecular weight material or a low molecular weight material, and may emit red light, green light, blue light, or white light.

An organic functional layer may be located above and/or below the first emission layer 122 and the second emission layer 122'. The organic functional layer may be located below the first emission layer 122 and the second emission layer 122'. In this case, the organic functional layer may be a hole transport layer (HTL) having a single-layer structure. Alternatively, the organic functional layer may include a hole injection layer (HIL) and an HTL.

Alternatively, the organic functional layer may be located on the first emission layer 122 and the second emission layer 122'. In this case, the organic functional layer may include an electron transport layer (ETL) and/or an electron injection layer (EIL). The organic functional layer may be integrally formed as a single body so as to correspond to the organic light-emitting diodes OLED and OLED' respectively included in the first display area DA1 and the second display area DA2.

The opposite electrode 123 is located on the first emission layer 122 and the second emission layer 122'. The opposite electrode 123 may include a conductive material having a low work function. For example, the opposite electrode 123 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 123 may further include a layer including ITO, IZO, ZnO, or $In_2O_3$ on the (semi)transparent layer including the material described above. The opposite electrode 123 may be integrally formed as a single body so as to correspond to the organic light-emitting diodes OLED and OLED' respectively included in the first display area DA1 and the second display area DA2.

The layers from the first pixel electrode 121 to the opposite electrode 123 in the first display area DA1 may constitute the first organic light-emitting diode OLED. The layers from the second pixel electrode 121' to the opposite electrode 123 in the second display area DA2 may constitute the second organic light-emitting diode OLED'.

A capping layer including an organic material may be located on the opposite electrode 123. The capping layer may be a layer provided to protect the opposite electrode 123 and increase light extraction efficiency. The capping layer may include an organic material having a refractive index higher than that of the opposite electrode 123.

The opposite electrode 123 may include a transmission hole TAH corresponding to the transmission area TA. When the transmission hole TAH corresponds to the transmission area TA, it may be understood that the transmission hole TAH overlaps the transmission area TA. FIG. 7 illustrates that the area of the transmission hole TAH is greater than the area of the first hole H1 defined in the inorganic insulating layer IL. However, the disclosure is not limited thereto. According to some embodiments, the area of the transmission hole TAH may be greater than or equal to the area of the first hole H1.

Due to the transmission hole TAH, a portion of the opposite electrode 123 is not present in the transmission area TA, which may significantly increase the light transmittance in the transmission area TA. The opposite electrode 123 having the transmission hole TAH may be formed by various methods. According to some embodiments, a material for forming the opposite electrode 123 is formed on the entire surface of the substrate 100, and a portion corresponding to the transmission area TA is removed through laser lift-off to form the opposite electrode 123 having the transmission hole TAH. According to some embodiments, the opposite electrode 123 having the transmission hole TAH may be formed through metal self-patterning (MSP). According to some embodiments, the opposite electrode 123 having the transmission hole TAH may be formed by a process of depositing the opposite electrode 123 using a fine metal mask (FMM).

The bottom metal layer BML of the second display area DA2 may be provided to correspond to the entire second display area DA2. In this case, the bottom metal layer BML may include a lower hole BMLH overlapping the transmission area TA. In some embodiments, the shape and size of the transmission area TA may be defined by the shape and size of the lower hole BMLH.

A thin-film encapsulation layer TFEL may be located on the organic light-emitting diodes OLED and OLED' of the display panel 10 as a sealing member. That is, the organic light-emitting diodes OLED and OLED' may be sealed by the thin-film encapsulation layer TFEL. The thin-film encapsulation layer TFEL may be located on the opposite electrode 123. The thin-film encapsulation layer TFEL may prevent or reduce infiltration of external moisture, contaminants, or foreign material into the organic light-emitting diodes OLED and OLED'.

The thin-film encapsulation layer TFEL may include at least one inorganic encapsulation layer and at least one organic encapsulation layer. In this regard, FIGS. 6 and 7 illustrate a structure in which the thin-film encapsulation layer TFEL includes a first inorganic encapsulation layer 131, an organic encapsulation layer 132, and a second inorganic encapsulation layer 133, which are stacked. According to some embodiments, the number of organic encapsulation layers and the number and stacking order of inorganic encapsulation layers may be changed.

The first inorganic encapsulation layer 131 and the second inorganic encapsulation layer 133 may include at least one inorganic insulating material selected from silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), and may be formed by chemical vapor deposition (CVD). The organic encapsulation layer 132 may include a polymer-based material. The polymer-based material may include an acrylic resin, an epoxy resin, polyimide, polyethylene, and the like.

The first inorganic encapsulation layer 131, the organic encapsulation layer 132, and the second inorganic encapsulation layer 133 may be integrally formed as a single body so as to cover the first display area DA1 and the second display area DA2. Accordingly, the first inorganic encapsulation layer 131 and the organic encapsulation layer 132 may be arranged inside the first hole H1 of the inorganic insulating layer IL.

Figure 8:
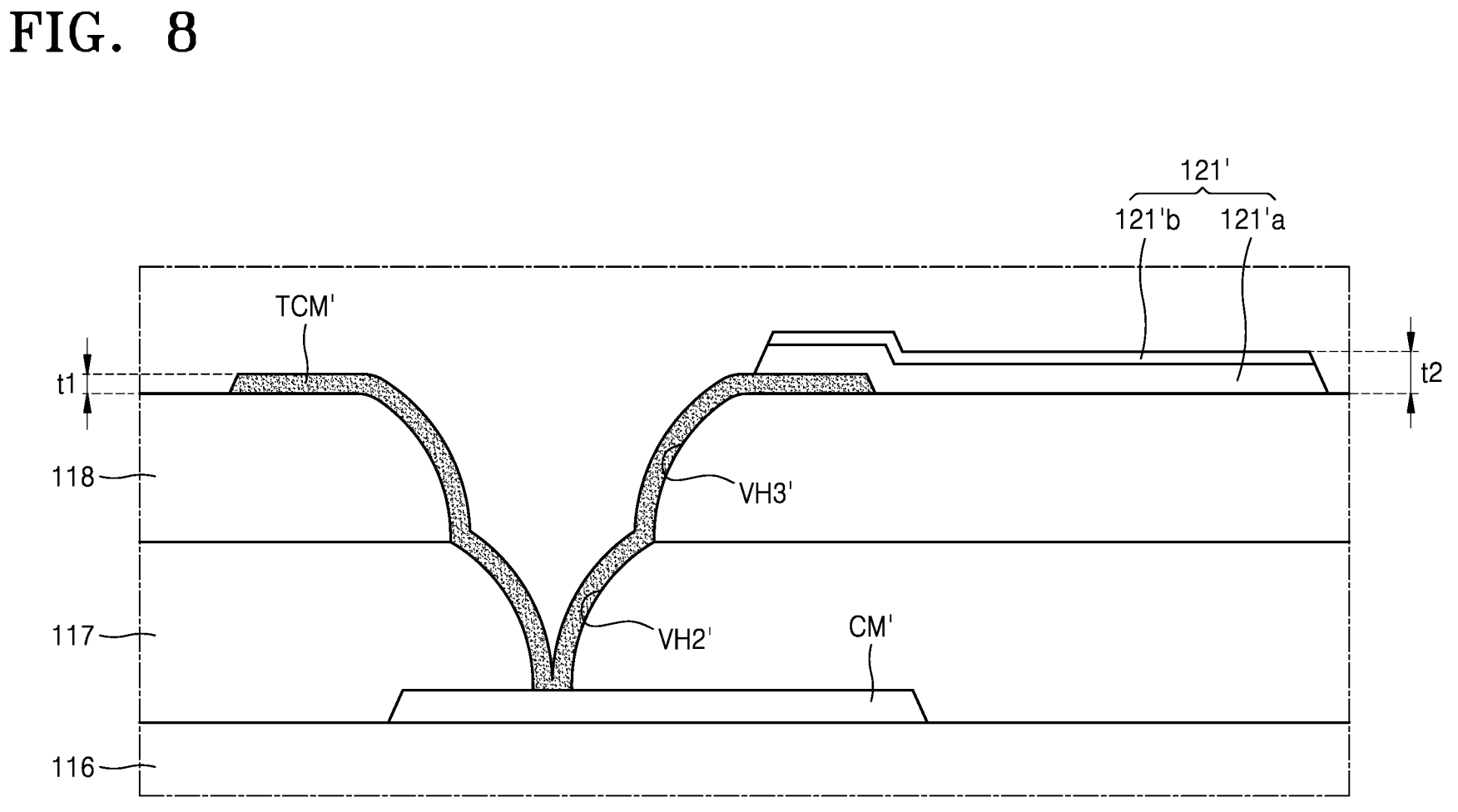
Figure 9:
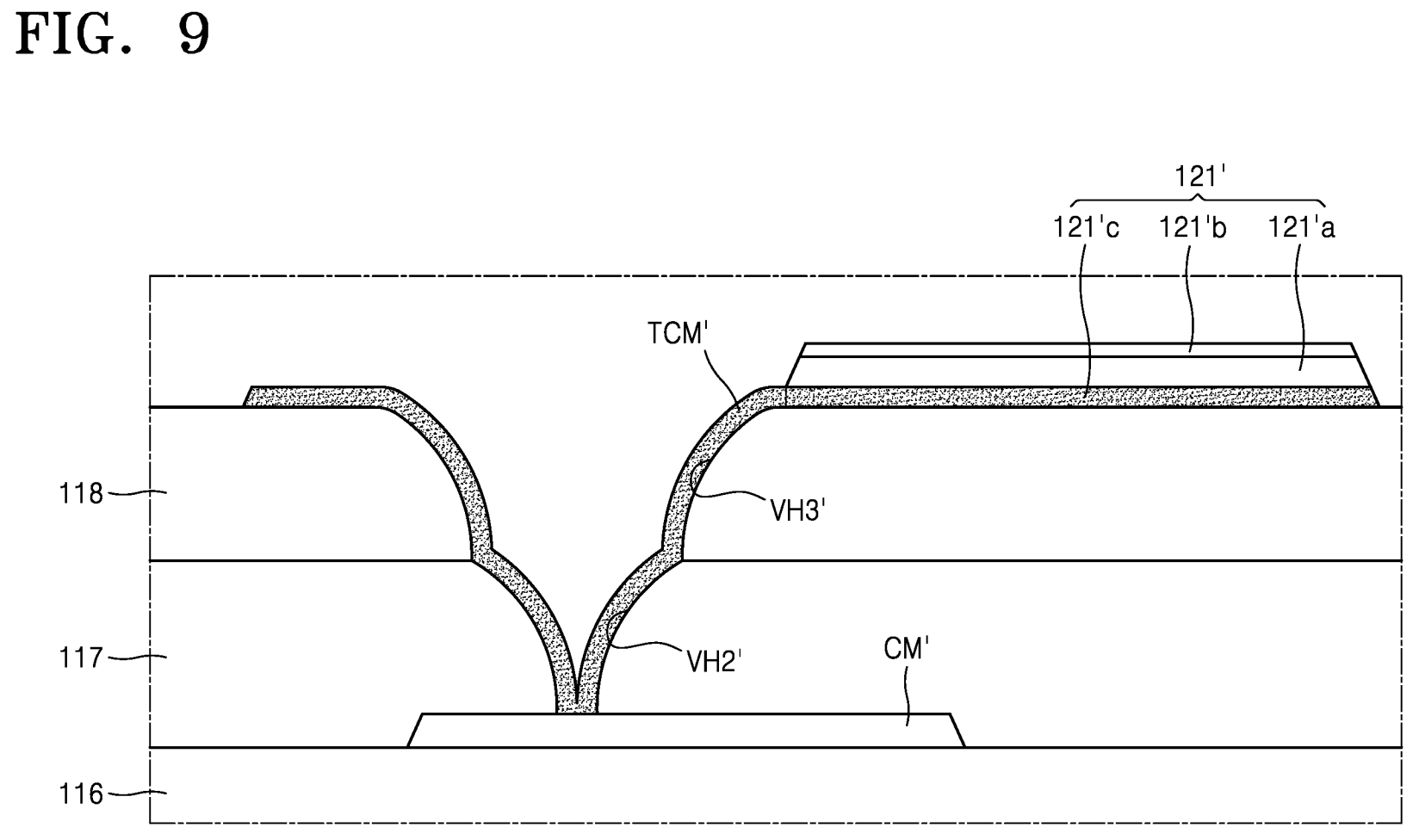

FIGS. 8 and 9 are cross-sectional views illustrating a portion of a display device, according to embodiments. For example, FIGS. 8 and 9 illustrate a second pixel electrode 121' and a second transparent connection electrode TCM'.

According to some embodiments, the second pixel electrode 121' may have a multilayer structure. For example, as illustrated in FIG. 8, the second pixel electrode 121' may be provided by stacking a first layer 121'a and a second layer 121'b.

The first layer 121'a may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof.

The second layer 121'b may include a conductive oxide such as ITO, IZO, ZnO, $In_2O_3$, IGO, or AZO. For example, the second layer 121'b may include ITO.

A thickness t2 of the second pixel electrode 121' may be about 1,000 Å to 1,500 Å. A thickness of the first layer 121'a may be about 800 Å to 1,200 Å. A thickness of the second layer 121'b may be about 80 Å to 150 Å. That is, the thickness of the second layer 121'b may be less than the thickness of the first layer 121'a.

The second transparent connection electrode TCM' may be connected to a second connection electrode CM' through via holes VH2' and VH3' of a third organic insulating layer 118 and a second organic insulating layer 117. The second transparent connection electrode TCM' may include a conductive oxide such as ITO, IZO, ZnO, $In_2O_3$, IGO, or AZO. As illustrated in FIG. 8, a thickness t1 of the second transparent connection electrode TCM' may be less than the thickness t2 of the second pixel electrode 121'. However, the disclosure is not limited thereto. The thickness t1 of the second transparent connection electrode TCM' may be equal to or similar to the thickness t2 of the second pixel electrode 121'. For example, the thickness t1 of the second transparent connection electrode TCM' may be about 1,000 Å to 1,500 Å.

Because the second transparent connection electrode TCM' does not include a reflective layer, light reflected from the second transparent connection electrode TCM' arranged in the via holes VH2' and VH3' may be minimized and interference due to the reflected light may be reduced.

On the other hand, referring to FIG. 9, the second pixel electrode 121' may further include a third layer 121'c located under the first layer 121'a. The third layer 121'c may be integrally formed as a single body along with the second transparent connection electrode TCM'. That is, the third layer 121'c of the second pixel electrode 121' may extend to function as the second transparent connection electrode TCM'. In this case, because the second pixel electrode 121' is flat as a whole without a portion in which a step is formed, interference between pieces of light reflected from the second pixel electrode 121' may be further reduced.

Figure 10:
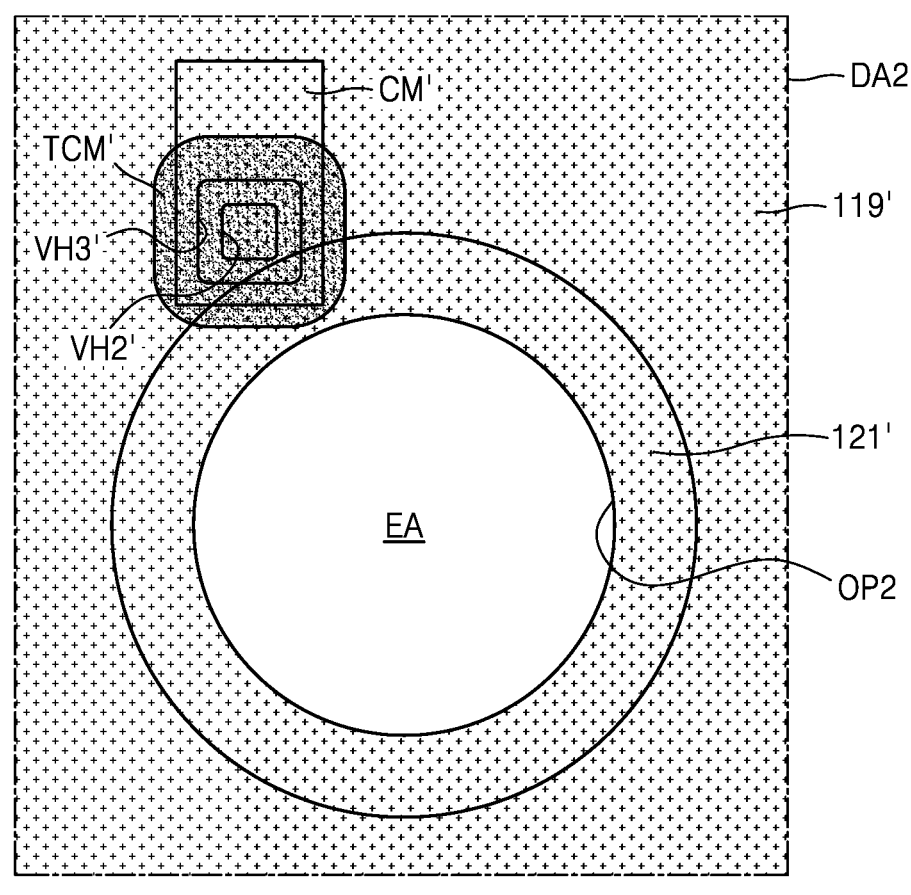
FIG. 10 is a plan layout diagram illustrating an auxiliary sub-pixel of a display device, according to some embodiments.

FIG. 10 is a plan layout diagram illustrating an auxiliary sub-pixel Pa of a display device, according to some embodiments.

Referring to FIG. 10, at least a portion of a second pixel electrode 121' of the auxiliary sub-pixel may have a round shape. According to some embodiments, the second pixel electrode 121' may have a substantially circular shape, as illustrated in FIG. 10. Because the second pixel electrode 121' has a round shape, angled corners outside the second pixel electrode 121' in a second display area DA2 are reduced or removed. Therefore, deterioration of display quality due to diffraction of reflected light may be prevented, reduced, or minimized.

A second transparent connection electrode TCM' may be arranged on one side of the second pixel electrode 121'. The second transparent connection electrode TCM' may be located under the second pixel electrode 121', and an end of the second pixel electrode 121' may cover at least a portion of the second transparent connection electrode TCM'. At least a portion of the second transparent connection electrode TCM' may have a round shape.

The second transparent connection electrode TCM' may be connected to a second connection electrode CM' located on another layer through via holes VH2' and VH3'. The second transparent connection electrode TCM' and the via holes VH2' and VH3' may not overlap a second opening OP2 of a pixel defining layer 119' defined as an emission area EA. This is because, when the second transparent connection electrode TCM' and the via holes VH2' and VH3' overlap the emission area EA, the flatness of the emission area EA may be lowered and the color may be distorted.

The pixel defining layer 119' defining the emission area EA may be located on the second pixel electrode 121'. The emission area EA may be defined by the second opening OP2 exposing the central portion of the second pixel electrode 121'. At least a portion of the emission area EA of the pixel defining layer 119', that is, the second opening OP2, may have a round shape. For example, the second opening OP2 may have a substantially circular shape, as illustrated in FIG. 9.

Because the pixel defining layer 119' includes a light blocking material, the pixel defining layer 119' may function as a black matrix. That is, the pixel defining layer 119' may prevent, reduce, or minimize light passing through the second display area DA2 from being diffracted through the edge of the second pixel electrode 121'.

In FIGS. 8 to 10, the description has been made based on the second pixel electrode 121' arranged in the second display area DA2, but the first pixel electrode 121 arranged in the first display area DA1 may also have the same characteristics as the second pixel electrode 121'. For example, at least a portion of the edge of the first pixel electrode 121 (see FIG. 6) may have a round shape. Also, the first pixel electrode 121 may have a three-layer structure, and one of the three layers may be integrally formed as a single body along with the first transparent connection electrode TCM.

FIGS. 11A to 11D are cross-sectional views sequentially illustrating a method of manufacturing a display panel, according to some embodiments, and schematically illustrate a portion of a second display area.

Figure 11A:
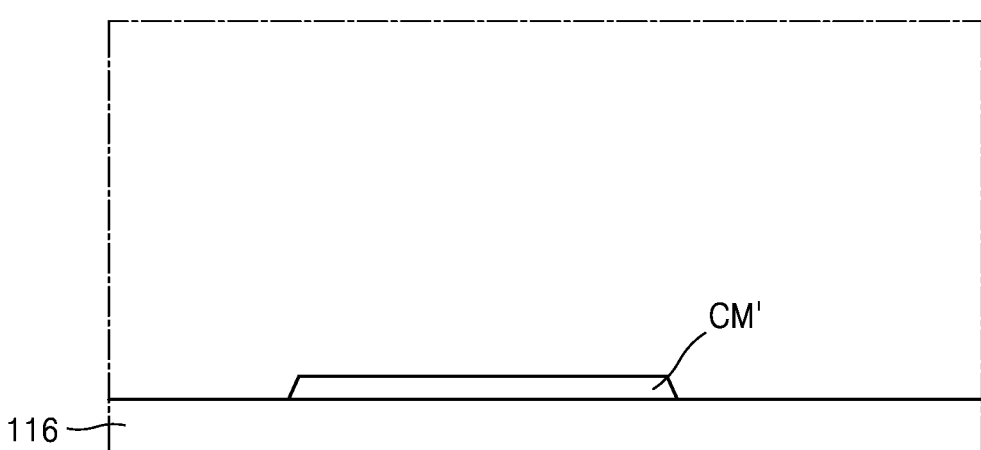
FIGS. 11A to 11D are cross-sectional views sequentially illustrating a method of manufacturing a display panel, according to some embodiments.

Referring to FIG. 11A, a second connection electrode CM' is formed on a first organic insulating layer 116. The first organic insulating layer 116 may be formed by using a spin coating process, a printing process, or the like.

The second connection electrode CM' may be formed by forming a metal and/or an alloy by using a sputtering process, a vacuum deposition process, a CVD process, a pulsed laser deposition process, a printing process, or an atomic layer deposition process, and then patterning the metal and/or the alloy by using an etching process.

Figure 11B:
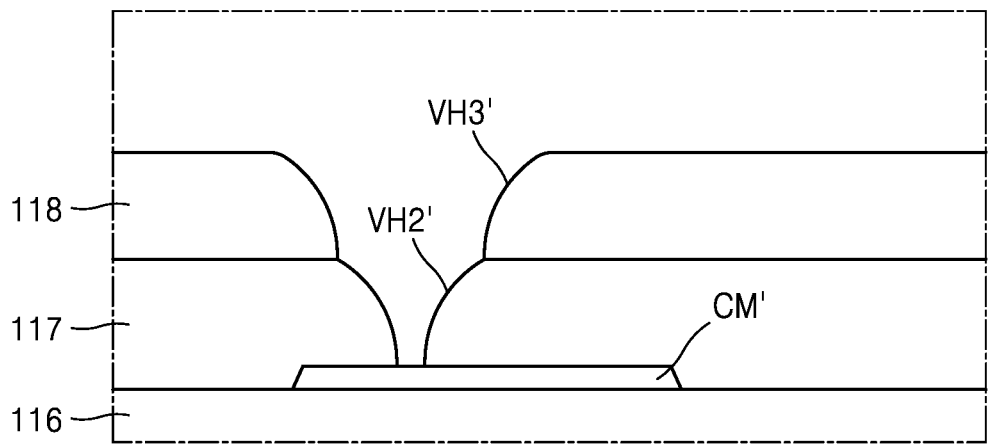

Referring to FIG. 11B, a second organic insulating layer 117 is formed on the second connection electrode CM'. In this case, the second organic insulating layer 117 is formed to have a via hole VH2' partially exposing the second connection electrode CM'. After a photosensitive material is formed by using a spin coating process or a printing process, the via hole VH2' may be formed in the second organic insulating layer 117 through an exposure process using a mask.

A third organic insulating layer 118 is formed on the second organic insulating layer 117. The third organic insulating layer 118 may be formed to have a via hole VH3' overlapping the via hole VH2' of the second organic insulating layer 117. Accordingly, a portion of the second connection electrode CM' may be exposed by the via hole VH2' of the second organic insulating layer 117 and the via hole VH3' of the third organic insulating layer 118.

Figure 11C:
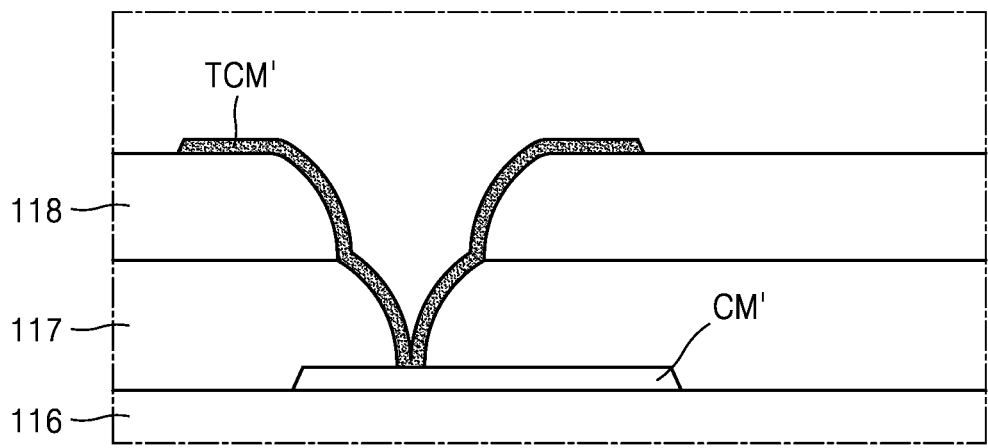

Referring to FIG. 11C, a second transparent connection electrode TCM' is formed on the third organic insulating layer 118. The second transparent connection electrode TCM' may be connected to the second connection electrode CM' through the via hole VH2' of the second organic insulating layer 117 and the via hole VH3' of the third organic insulating layer 118.

The second transparent connection electrode TCM' may be formed by using a transparent conductive material. The second transparent connection electrode TCM' may be formed by forming a transparent conductive material by using a sputtering process, a vacuum deposition process, a CVD process, a pulsed laser deposition process, a printing process, or an atomic layer deposition process, and then patterning the transparent conductive material by using an etching process.

Figure 11D:
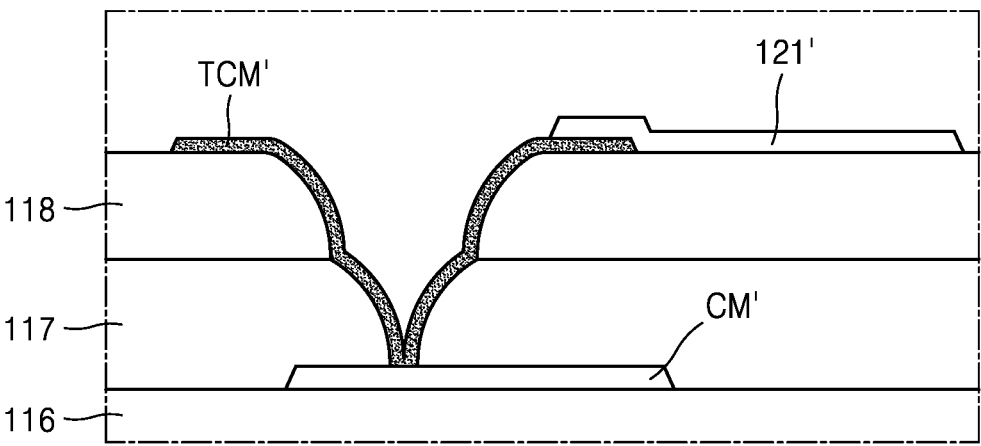

Referring to FIG. 11D, a second pixel electrode 121' is formed on the third organic insulating layer 118 to cover the end of the second transparent connection electrode TCM'.

The second pixel electrode 121' may be formed by using a reflective material. For example, the second pixel electrode 121' may include Ag, Mg, Al, Pt, Pd, Au, Ni, Nd, Ir, Cr, Li, Yb, or Ca. The materials described above may be used alone or in combination. Also, the second pixel electrode 121' may be formed in a single-layer structure or a multilayer structure including the metal and/or the alloy described above. In some embodiments, the second pixel electrode 121' is a reflective electrode and may include an Ag/ITO structure.

The second pixel electrode 121' may be formed by using a sputtering process, a vacuum deposition process, a CVD process, a pulsed laser deposition process, a printing process, or an atomic layer deposition process. The second pixel electrode 121' may be patterned for each sub-pixel.

As such, because the second pixel electrode 121' is connected to the second connection electrode CM' or the second pixel circuit PC' (see FIG. 7) through the second transparent connection electrode TCM' that does not include a reflective material, reflective color bands caused by reflected light may be significantly reduced.

As described above, because the display panel and the electronic apparatus according to the embodiments include the transparent connection electrode connected to the pixel electrode on the same layer as the pixel electrode, reflective color bands may be reduced.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. An electronic apparatus comprising:
a display panel comprising a first display area, in which a first display element is arranged, and a second display area, in which a second display element and a transmission area are arranged; and
a component on a lower surface of the display panel and overlapping the second display area,
wherein the display panel comprises:
a substrate;
a second pixel circuit on the substrate and electrically connected to the second display element, the second pixel circuit comprising at least one thin-film transistor;
an organic insulating layer covering the at least one thin-film transistor; and
a second transparent connection electrode on the organic insulating layer in the second display area and electrically connected to the second pixel circuit,
wherein the second display element comprises a second pixel electrode at least partially overlapping the second transparent connection electrode in a plan view and at least partially on a same layer as the second transparent connection electrode.

2. The electronic apparatus of claim 1, wherein the second pixel electrode includes a reflective material.

3. The electronic apparatus of claim 1, wherein the second pixel electrode covers one end of the second transparent connection electrode.

4. The electronic apparatus of claim 1, wherein the second pixel electrode comprises a first layer and a second layer on the first layer, the first layer including a reflective material and the second layer including a transparent conductive material.

5. The electronic apparatus of claim 1, wherein the second transparent connection electrode is inside a via hole defined in the organic insulating layer.

6. The electronic apparatus of claim 1, wherein the second pixel electrode comprises a first layer including a reflective material and a third layer under the first layer, and the third layer is integral with the second transparent connection electrode.

7. The electronic apparatus of claim 1, wherein at least a portion of an edge of the second pixel electrode has a round shape.

8. The electronic apparatus of claim 1, further comprising a pixel defining layer having an opening exposing a center of the second pixel electrode and covering an edge of the second pixel electrode, wherein the pixel defining layer includes a light blocking material.

9. A display panel comprising: a substrate; a first display element on the substrate; a first pixel circuit on the substrate and electrically connected to the first display element, the first pixel circuit comprising at least one thin-film transistor; an organic insulating layer covering the at least one thin-film transistor; and a first transparent connection electrode on the organic insulating layer and electrically connected to the first pixel circuit, wherein the first display element comprises a first pixel electrode at least partially overlapping the first transparent connection electrode in a plan view and at least partially on a same layer as the first transparent connection electrode.

10. The display panel of claim 9, wherein the first pixel electrode comprises a first layer and a second layer on the first layer, the first layer including a reflective material and the second layer including a first transparent conductive material, and the first transparent connection electrode includes a second transparent conductive material.

11. The display panel of claim 9, wherein the first transparent connection electrode covers one end of the first pixel electrode.

12. The display panel of claim 9, wherein the organic insulating layer is provided by sequentially stacking a first organic insulating layer, a second organic insulating layer, and a third organic insulating layer, and the first transparent connection electrode is connected to a first connection electrode on the first organic insulating layer through a via hole.

13. The display panel of claim 12, wherein the third organic insulating layer includes a siloxane-based organic material.

14. The display panel of claim 9, wherein at least a portion of an edge of the first pixel electrode has a round shape.

15. The display panel of claim 9, further comprising a pixel defining layer having an opening exposing a center of the first pixel electrode and covering an edge of the first pixel electrode, wherein the pixel defining layer includes a light blocking material.

* * * * *